US012575092B2

(12) United States Patent
Gao et al.

(10) Patent No.: US 12,575,092 B2
(45) Date of Patent: Mar. 10, 2026

(54) SEMICONDUCTOR STRUCTURE AND MEMORY

(71) Applicant: CHANGXIN MEMORY TECHNOLOGIES, INC., Hefei City (CN)

(72) Inventors: Yicheng Gao, Hefei (CN); Jaeyong Cha, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 397 days.

(21) Appl. No.: 18/451,154

(22) Filed: Aug. 17, 2023

(65) Prior Publication Data

US 2024/0081050 A1      Mar. 7, 2024

Related U.S. Application Data

(63) Continuation of application No. PCT/CN2022/123987, filed on Oct. 9, 2022.

(30) Foreign Application Priority Data

Sep. 1, 2022    (CN) .......................... 202211067383.5

(51) Int. Cl.
*H10B 12/00* (2023.01)
*G11C 11/4091* (2006.01)
*G11C 11/4094* (2006.01)

(52) U.S. Cl.
CPC .......... *H10B 12/50* (2023.02); *G11C 11/4091* (2013.01); *G11C 11/4094* (2013.01)

(58) Field of Classification Search
CPC .... H10B 12/50; H10B 10/12; G11C 11/4091; G11C 11/4094; G11C 2207/005; G11C 7/18; G11C 11/4097; G11C 7/12; G11C 5/025; H10D 89/10
See application file for complete search history.

(56) References Cited

FOREIGN PATENT DOCUMENTS

CN          1302085 A   *   7/2001

* cited by examiner

*Primary Examiner* — Mohammad A Rahman
(74) *Attorney, Agent, or Firm* — Syncoda LLC; Feng Ma

(57) ABSTRACT

A semiconductor structure and a memory are provided. The semiconductor structure includes multiple active regions, a column selector and multiple bit lines. The column selector includes a first gate, a second gate, a third gate, a fourth gate and a connection line. The first gate and the second gate intersect at a first node, the third gate and the fourth gate intersect at the second node, and the connection line connects the first node and the second node. Each of the multiple bit lines includes a first portion, a second portion and a connection portion. Each of the multiple bit lines is connected to a respective one of the multiple active regions, the active regions connected to different bit lines among the multiple bit lines are different.

14 Claims, 10 Drawing Sheets

100

523

523

Y
↑
└→ X

523

506

501

523

510

507

502

508

503

504

509

Y
X

SEMICONDUCTOR STRUCTURE AND MEMORY

CROSS-REFERENCE TO RELATED APPLICATIONS

The present application is a continuation of International Application No. PCT/CN2022/123987, filed on Oct. 9, 2022, which is based upon and claims priority to Chinese patent application No. 202211067383.5, filed on Sep. 1, 2022. The disclosures of International Application No. PCT/CN2022/123987 and Chinese patent application No. 202211067383.5 are hereby incorporated by reference in their entireties.

BACKGROUND

A Dynamic Random Access Memory (DRAM) includes memory cells (memory bits) arranged in an array. Each memory cell includes a transistor and a capacitor. The transistor acts as a switch between the capacitor and a bit line, and can be activated by a Word Line (WL) coupled to a control terminal of the transistor. The memory cell can store binary information as charges on the capacitor.

The DRAM includes not only multiple memory cells arranged in repeated arrays, but also a bit line select unit for selecting a Bit Line (BL) for performing read and write operations. The bit line select unit controls turn on or turn off of the BL. That is, the bit line select unit controls whether the read and write operations are performed on the memory cells through the BL. However, the design of the bit line select unit faces many challenges.

SUMMARY

Embodiments of the present disclosure relate to the field of semiconductor technologies, and in particular, to a semiconductor structure and a memory.

According to one aspect of the present disclosure, there is provided a semiconductor structure including multiple active regions, a bit line select unit and multiple bit lines.

The multiple active regions are arranged in an array along a first direction and a second direction that are orthogonal, the first direction is parallel to a direction in which the multiple active regions extend.

The bit line select unit include: a first gate, a second gate, a third gate and a fourth gate, each of which is located on a respective one of four active regions adjacent to each other among the multiple active regions, the first gate and the second gate extend along the second direction and intersect at a first node, the third gate and the fourth gate extend along the second direction and intersect at a second node; and a connection line connecting the first node and the second node and extending along the first direction.

The multiple bit lines are arranged along the first direction. Each of the multiple bit lines includes a first portion, a second portion and a connection portion connecting the first portion and the second portion, both the first portion and the second portion extend along the second direction and are misaligned in the first direction, each of the multiple bit lines is connected to a respective one of the multiple the active regions, the active regions connected to different bit lines among the multiple bit lines are different, and for each bit line, the first portion of the bit line and a second portion of an adjacent bit line are on a same straight line parallel to the second direction.

According to another aspect of the present disclosure, there is provided a memory including any one of the semiconductor structures of the present disclosure.

DETAILED DESCRIPTION

Figure 1:
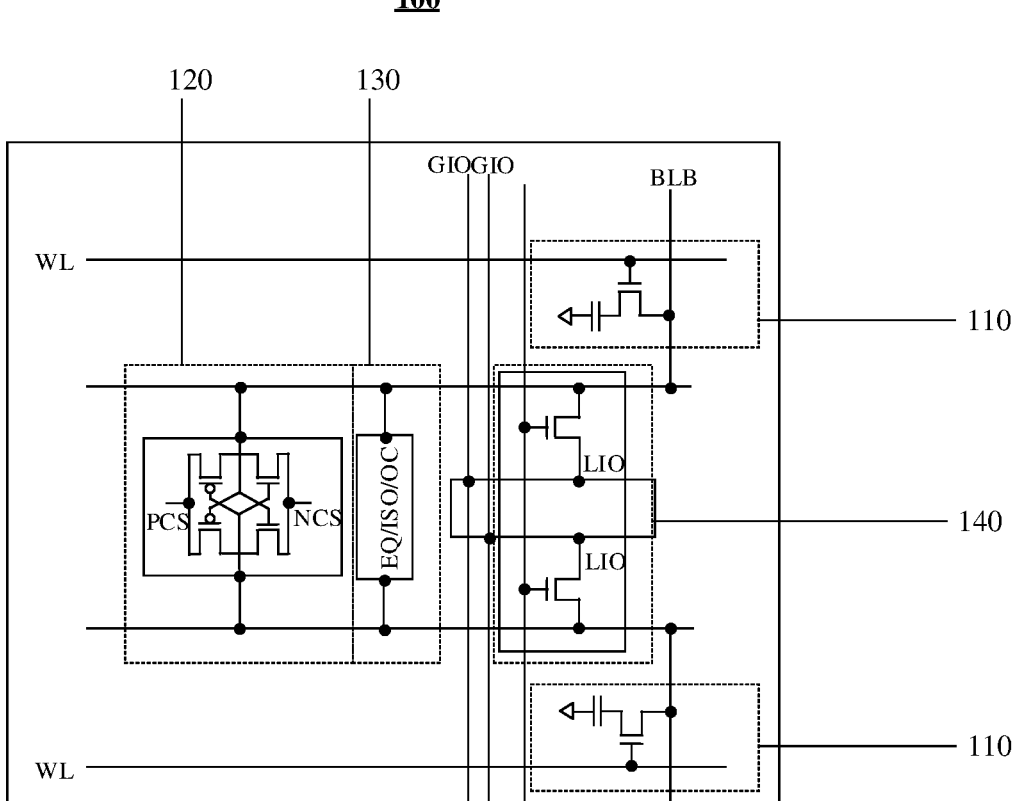
FIG. 1 is a partial circuit diagram of a memory provided by an embodiment of the present disclosure.

In order to make the technical solution and advantages of the embodiments of the present disclosure clearer, the technical solution of the present disclosure will be further described in detail below with reference to the drawings and embodiments. While exemplary embodiments of the present disclosure are shown in the drawings, it should be understood that the present disclosure may be implemented in various forms and should not be limited by the embodiments set forth herein. Rather, these embodiments are provided to enable a more thorough understanding of the present disclosure and to fully convey the scope of the present disclosure to those skilled in the art.

The present disclosure is described more specifically by way of example in the following paragraphs with reference to the accompanying drawings. The advantages and features of the present disclosure will become clearer from the following description and claims. It is to be noted that the drawings are all in very simplified form and are made with imprecise proportions for the purpose of conveniently and clearly assisting in the illustration of the embodiments of the disclosure.

It is understood that the meanings of "on", "above" and "over" in the present disclosure should be interpreted in the broadest manner, so that the term "on" not only has the meaning of "on" something without intervening features or layers (i.e., directly on something), but also has meaning of "on" something with intervening features or layers.

In addition, for ease of description, spatial relative terms such as "on", "above", "over", "upper", "top" and the like may be used herein to describe the relationship between one element or feature and another element or feature as shown. In addition to the orientations depicted in the drawings, the spatial relative term is intended to encompass different orientations of the device in use or operation. An apparatus may be oriented in other ways (rotated 90 degrees or in other orientations) and the spatial relative descriptors used herein may likewise be interpreted accordingly.

In embodiments of the present disclosure, the terms "first" and "second" are used for descriptive purposes only and are not understood to indicate or imply relative importance or to imply the number of indicated technical features. Thus, a feature defined as "first" and "second" may explicitly or implicitly includes one or more of such features. In the description of the present disclosure, "multiple" means two or more than two, unless otherwise expressly and specifically defined.

In embodiments of the present disclosure, unless otherwise expressly specified and limited, the terms "mounted", "coupled", "connected" and "fixed" and the like are understood in a broad sense and may be, for example, a fixed connection, a detachable connection, or an integral connection; a mechanical connection or an electrical connection; a direct connection or an indirect connection through an intermediate medium, or an internal communication of two elements. For those of ordinary skill in the art, the specific meaning of the above terms in the present disclosure may be understood on a case-by-case basis.

It should be noted that the technical solutions described in the embodiments of the present disclosure can be arbitrarily combined without conflict.

FIG. 1 is a partial circuit diagram of a memory provided by an embodiment of the present disclosure. With reference to FIG. 1, a memory 100 includes Word Lines (WL), a Bit Line (BL), a Bit Line Bar (BLB), a memory cell 110, a Sense Amplifier (SA) 120, an Equalizer (EQ) 130, and a bit line select unit 140 (otherwise referred to as a column selector). The memory unit 110 has been described before and will not be repeated here. The SA 120 is connected between the BL and the BLB for detecting and amplifying a voltage difference between a pair of the BL and the BLB. The EQ 130 is located between the BL and the BLB. The EQ is configured to equalize voltages of the BL and the BLB. An Isolator (ISO) unit is configured to isolate the BL and the BLB. An Offset Cancel (OC) unit is configured to eliminate characteristic differences of different transistors connected to the BL and the reference BL. The bit line select unit 140 is configured to select a BL that performs read and write operations, and to control the BL to be turned on or turned off. That is, the bit line select unit 140 controls whether the read and write operations are performed on the memory cell 110 through the BL.

Figure 2:
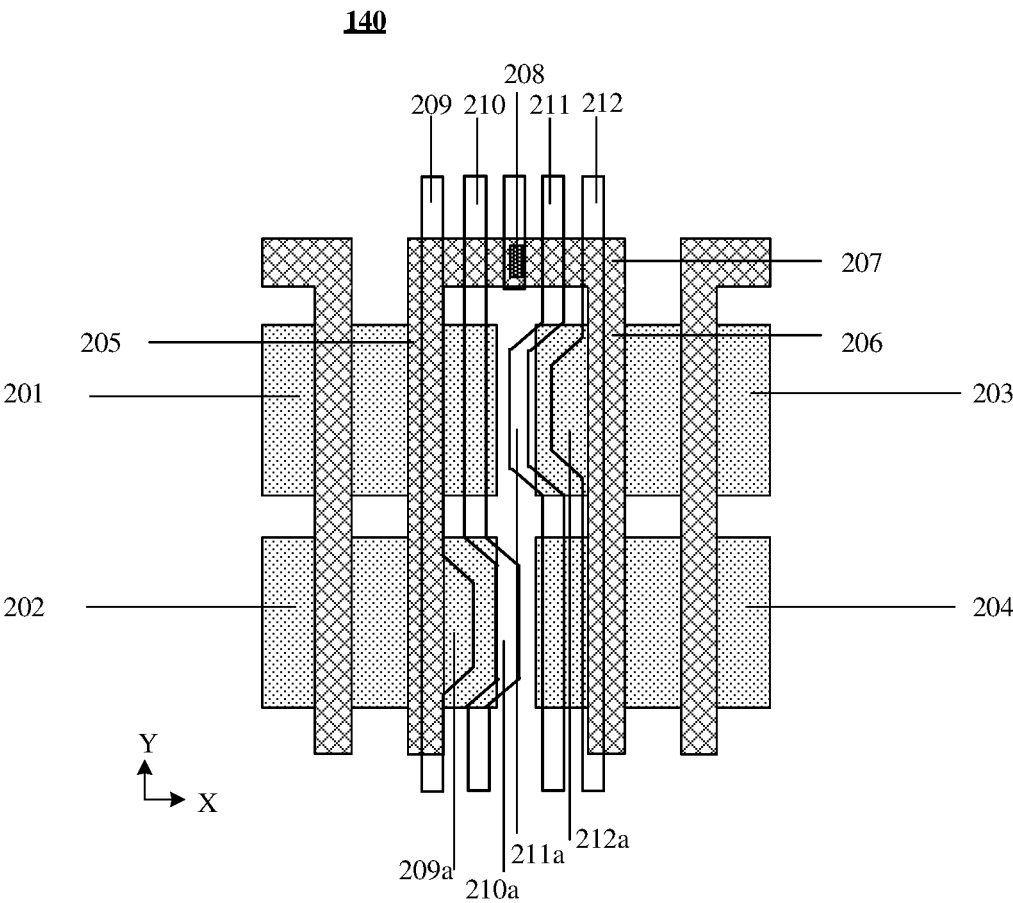
FIG. 2 is a layout diagram of a semiconductor structure provided by an embodiment of the present disclosure.

In order to ensure that the data amplified by the SA can be read effectively and quickly, the data transmitted to the Local Input and Output (LIO) requires good switching characteristics of the bit line select unit. FIG. 2 is a layout diagram of a semiconductor structure provided by an embodiment of the present disclosure. As shown in FIG. 2, the number of transistors corresponding to the bit line select unit is four, and gates of the four transistors are all connected to a bit line select line (column select line, CSL). The number of transistors corresponding to the bit line select unit in FIG. 2 is used only for example purposes and is not used to limit the number of transistors corresponding to the bit line select unit in the embodiment of the present disclosure.

The active regions of the transistors corresponding to the bit line select unit are arranged in an array along the first direction and second direction that are orthogonal. The first direction is parallel to a direction in which the active regions extend. Taking FIG. 2 as an example, the first direction can be the X-axis direction, the second direction can be the Y-axis direction, and four active regions 201, 202, 203 and 204 are adjacent to each other.

Taking FIG. 2 as an example, the bit line select unit includes a first portion 205 located on the active region 201 and the active region 202, a second portion 206 located on the active region 203 and the active region 204, and a third portion 207 located outside the active regions and only close to one side of the active regions. The third portion shown in FIG. 2 is located on a side close to the active region 201 and the active region 203. In this case, the bit line select unit forms an inverted "U" shape. In practice, the third portion may also be located on a side close to the active region 202 and the active region 204. In this case, the bit line select unit forms a "U" shape. In fact, each of the first portion 205 and the second portion 206 includes two gates connected to each other, the third portion includes a conductive connection line, and the bit line select unit further includes a conductive contact 208 located in the middle of the third portion 207. The conductive contact 208 is connected to the CSL and supplies electrical signals to the bit line select unit through the CSL.

Four bit lines 209, 210, 211 and 212 connected to the transistors corresponding to the bit line select unit are arranged along the X-axis direction, and each bit line extends along the Y-axis direction. The bit line 209 includes a strip pattern extending along the Y-axis direction and a protruding portion 209a. An orthographic projection of the protruding portion 209a of the bit line 209 on a plane on which the active regions are located falls within the active region 202. The bit line 210 includes a strip pattern extending along the Y-axis direction and a misaligned bent portion 210a. An orthographic projection of the bit line 210 on the plane on which the active regions are located falls within the active region 201. An orthographic projection of the misaligned bent portion 210a on the plane on which the active regions are located is misaligned in the X-axis direction from the protruding portion 209a of the bit line 209. In other words, the orthographic projection of the misaligned bent portion 210a on the plane on which the active regions are located does not coincide with the active regions. The bit line 212 includes a strip pattern extending along the Y-axis direction and a projecting portion 212a. An orthographic projection of the protruding portion 212a of the bit line 212 on the plane on which the active regions are located falls within the active region 203. The bit line 211 includes a strip pattern extending along the Y-axis direction and a misaligned bent portion 211a. An orthographic projection of part of the bit line 211 on the plane on which the active regions are located falls within the active region 204. An orthographic projection of the misaligned bent portion 211a on the plane on which the active regions are located is misaligned from the protruding portion 212a of the bit line 212 in the X-axis direction. In other words, the orthographic projection of the misaligned bent portion 211a on the plane on which the active regions are located does not coincide with the active region.

It can be understood that, regardless of the "U" shape or the inverted "U" shape, a distance between the conductive contact and a transistor close to the third portion is different from a distance between the conductive contact and a transistor away from the third portion. In this case, a resistance between the conductive contact and the transistor away from the third portion of the bit line select unit is relatively large, which will cause a voltage drop problem. That is, a voltage on the transistors close to the third portion will be greater than a voltage on the transistor away from the third portion. At the same time, different distances between the conductive contact and the transistors will also cause time delay, which is not conducive to the precise control of the bit line select unit.

It is further understood that a bit line with a protruding portion or a bit line with a misaligned bent portion is relatively close to an adjacent bit line, so that a coupling effect and a noise effect between the bit lines easily occur, and thus the produced bit line select unit has poor performance.

Figure 3A:
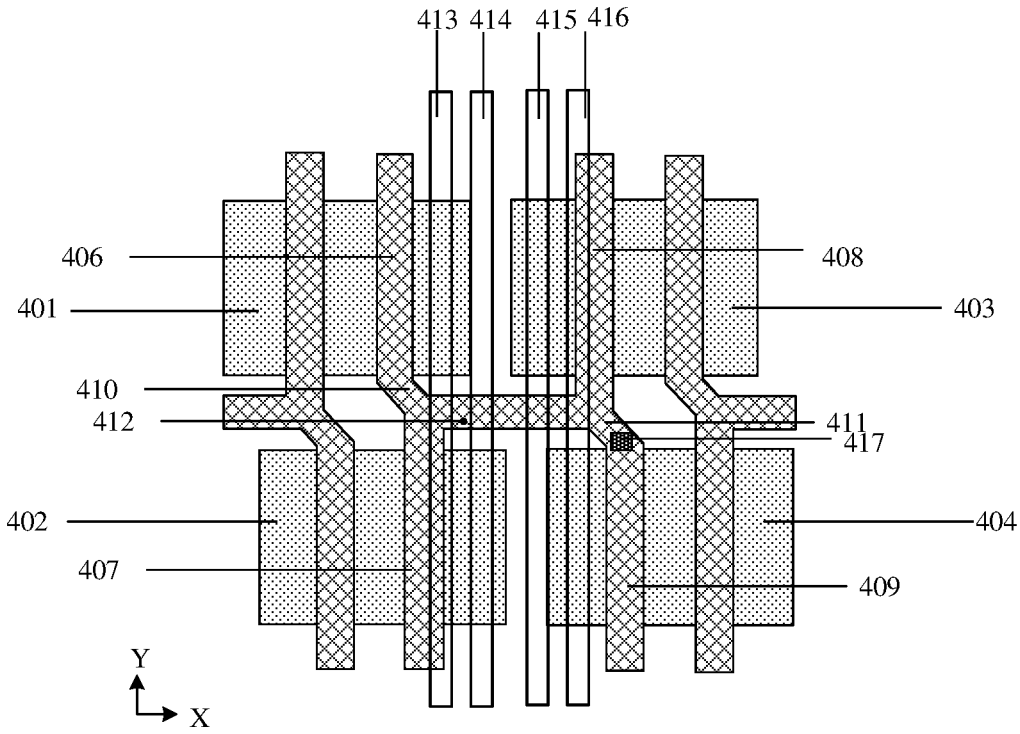
FIG. 3A is a layout diagram of another semiconductor structure provided by the embodiment of the present disclosure.

In order to reduce the coupling effect and the noise effect between bit lines, the voltage imbalance and time delay caused by the position where the conductive contact is located, the embodiment of the present disclosure discloses a bit line select unit with an oblique "H" shape, as shown in FIG. 3A which is a layout diagram of another semiconductor structure provided by the embodiment of the present disclosure.

In order to make the bit lines straight, the active regions in the multiple transistors corresponding to the bit line select unit are arranged in an array. As shown in FIG. 3A, when the active regions are arranged, two adjacent rows of active regions are misaligned along the X-axis direction. Four active regions 401, 402,403 and 404 are adjacent to each other, and the active regions 402, 404 and the active regions 401, 403 are misaligned along a positive direction of the X-axis. The active regions in FIG. 3A misaligned along the positive direction of the X-axis are only used as an example and are not used as a limitation. The active regions may be misaligned along the positive direction or the negative direction of the X-axis.

Taking FIG. 3A as an example, the bit line select unit includes: a first gate 406 located in the first active region 401, a second gate 407 located in the second active region 402, a third gate 408 located in the third active region 403, a fourth gate 409 located in the fourth active region 404, a first connection line 410 connecting the first gate 406 with the second gate 407, a second connection line 411 connecting the third gate 408 with the fourth gate 409, and a third connection line 412 connecting the first connection line 410 with the second connection line 411.

Since the first gate 406, the second gate 407, the third gate 408, and the fourth gate 409 of the bit line select unit all extend along the Y-axis direction, the first gate 406 and the second gate 407 are misaligned along the positive direction of the X-axis, and the third gate 408 and the fourth gate 409 are misaligned along the positive direction of the X-axis, the misalignment direction between the gates is the same as the misalignment direction between the active regions. In order to connect the four portions of the bit line select unit, the bit line select unit further includes the first connection line 410 connecting the first gate 406 and the second gate 407, the second connection line 411 connecting the third gate 408 and the fourth gate 409, and the third connection line 412 connecting the first connection line 410 and the second connection line 411. In this case, the gates and the connection lines included in the bit line select unit form an "H" shape with a certain inclination angle.

In addition, the bit line select unit further includes a conductive contact 417 located on the first connection line 410 or the second connection line 411. The conductive contact 417 is used to supply electrical signals to the bit line select unit.

Four bit lines 413, 414, 415, and 416 connected to the transistors corresponding to the bit line select unit are arranged along the X-axis direction and each of the four bit lines 413, 414, 415, and 416 extends along the Y-axis direction to form a straight line. An orthographic projection of a portion of the bit line 413 close to the first gate 406 on a plane on which the active regions are located falls within the first active region 401. An orthographic projection of a portion of the bit line 414 close to the second gate 407 on a plane on which the active regions are located falls within the second active region 402. An orthographic projection of a portion of the bit line 415 close to the third gate 408 on a plane on which the active regions are located falls within the third active region 403. An orthographic projection of a portion of the bit line 416 close to the fourth gate 409 on a plane on which the active regions are located falls within the fourth active region 404.

It can be understood that in the above-mentioned embodiment, due to the misaligned array arrangement of the active regions, and the gates and the connection lines included in the bit line select unit form an "H" shape with a certain inclination angle, each bit line can be respectively connected to only one active region when the bit line is in a straight line. In this case, the straight bit lines effectively reduce the coupling effect and the noise effect between bit lines. At the same time, the conductive contact 417 is close to the four transistors, which effectively alleviates the problem of voltage drop and time delay in the previous embodiment.

However, the abnormal shape of the inclination angle in this embodiment brings great difficulty to the process manufacturing and production, and it is difficult to accurately connect the first connection line 410, the second connection line 411 and the third connection line 412. Moreover, the formed H-shaped bit line select unit with a certain inclination angle still has some discrepancy in its actual shape after OPC, which affects the device performance.

Figure 3B:
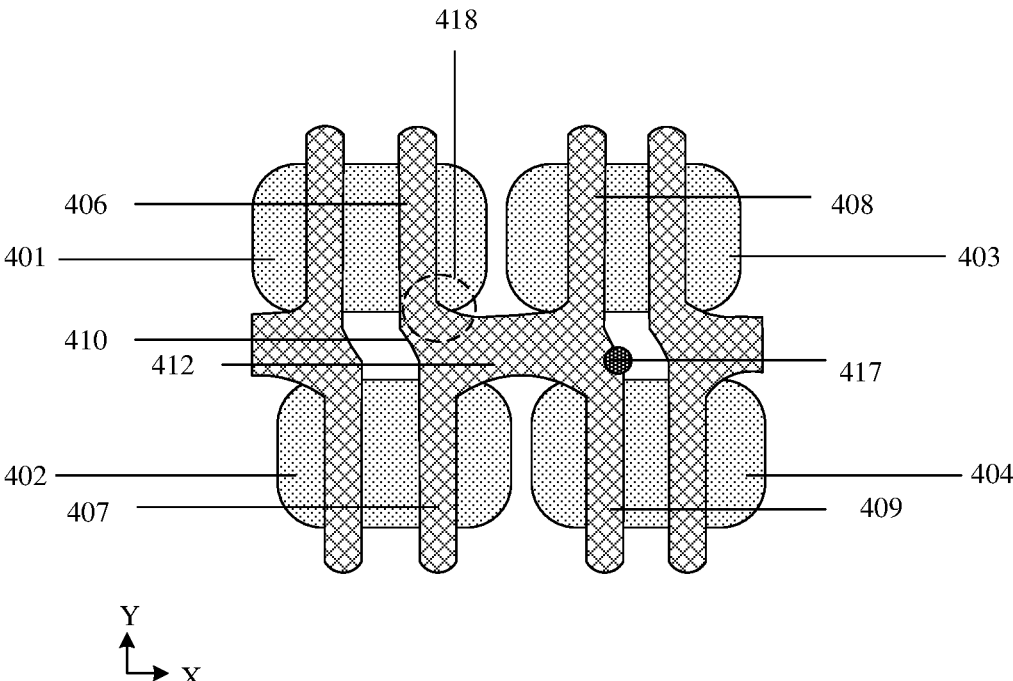
FIG. 3B is a plan view of the semiconductor structure provided in FIG. 3A after optical proximity correction and etching process.

FIG. 3B is a plan view of the semiconductor structure provided in FIG. 3A after optical proximity correction and etching process. As shown in FIG. 3A, an orthographic projection of the first connection line 410 of bit line select unit on a plane on which the first active region 401 is located does not intersect with the first active region 401. However, for the first connection line after the optical proximity correction and etching process shown in FIG. 3B, it can be seen that the orthographic projection of the first connection line 410 on the plane on which the first active region 401 is located overlaps with the first active region 401, and the overlapping portion 418 is shown in FIG. 3B. The overlapping portion 418 causes the channel of the transistor in which the first gate 406 of the bit line select line is located to be widened and causes the performance to deteriorate.

Figure 3C:
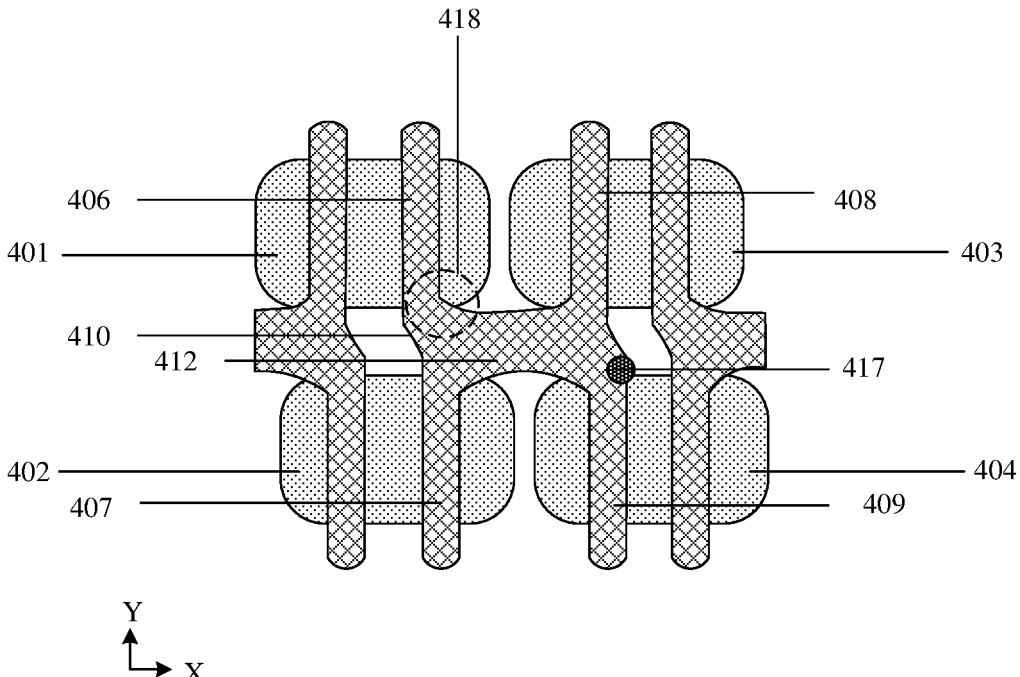
FIG. 3C is another plan view of the semiconductor structure provided in FIG. 3A after optical proximity correction and etching process.

In addition, there is a risk that the conductive contact on the first connection line or the second connection line of the bit line select unit may slip out. In actual production, the location of the conductive contact may be offset. As shown in FIG. 3B, although most of the conductive contact 417 is located on the second connection line of the bit line select unit, there is still a small portion of the conductive contact 417 that is not located on the bit line select unit, but is located in a portion between the third active region 403 and the fourth active region 404, which is prone to cause leakage. Worse still, if the portion of the conductive contact 417 that is offset is not only between the active region 403 and the active region 404, but is also offset a little in a direction towards the fourth active region, as shown in FIG. 3C, and falls on the fourth active region 404, at this time, not only leakage of electricity but also short circuit may occur, which may lead to greater problems.

Based on this, in order to solve one or more of the above problems, an embodiment of the present disclosure provides a semiconductor structure. The semiconductor structure includes multiple active regions, a bit line select unit and multiple bit lines.

The multiple active regions are arranged in an array along a first direction and a second direction that are orthogonal. The first direction is parallel to a direction in which the active regions extend.

The bit line select unit includes: a first gate, a second gate, a third gate and a fourth gate, each of which is located on a respective one of four of the active regions adjacent to each other, the first gate and the second gate extend along the second direction and intersect at a first node, the third gate and the fourth gate extend along the second direction and intersect at a second node; and a connection line connecting the first node and the second node and extends along the first direction.

The multiple bit lines are arranged along the first direction. Each of the multiple bit lines includes: a first portion and a second portion both extending along the second direction and being misaligned in the first direction, and a connection portion connecting the first portion and the second portion. Each bit line is connected to a respective one active region, the active regions connected to different bit lines are different, and for each bit line, the first portion of the bit line and a second portion of an adjacent bit line are on a same straight line parallel to the second direction.

FIGS. 4A to 4D are four layout diagrams of another semiconductor structure provided by the embodiment of the present disclosure. FIG. 4E is a plan view of the semiconductor structure provided by FIG. 4A after optical proximity correction and etching process. The semiconductor structure provided by the embodiment of the present disclosure will be described in detail below with reference to FIGS. 4A to 4E.

The first direction is parallel to a direction in which each active region extends, and the second direction is perpendicular to the first direction and parallel to the plane on which the active regions are located. In some specific embodiments, the first direction may be a direction extending along the X axis and the second direction may be a direction extending along the Y axis.

It should be noted that the bit line select unit in the embodiments of the present disclosure may correspond to four transistors or a greater number of transistors, such as eight or the like. Only the case where the bit line select unit corresponds to four transistors is shown in FIGS. 4A to 4E, and the presentation in FIGS. 4A to 4E is not intended to limit the number of transistors corresponding to the bit line select unit in the embodiments of the present disclosure.

It should be noted that in the embodiment of the present disclosure, the active region and the bit line select unit are described in parallel for convenience of description, but in practical application, the active region can actually be assigned to the bit line select unit.

The multiple active regions may be arranged in an array along the first direction and the second direction, and different active regions are spaced by an insulating structure (e.g., a Shallow Trench Isolation (STI) structure). Each active region extends along the first direction, and each active region has a strip shape. The strip shape may be a right-angled strip shape or a rounded strip shape. Exemplarily, with reference to FIG. 4A, each active region extends along the X-axis direction and each active region has a right-angled strip shape.

The bit line select unit includes multiple gates corresponding to the transistors, each of the multiple gates is oriented along the Y-axis direction and each gate spans an active region. Exemplarily, with reference to FIG. 4A, the multiple gates may specifically include a first gate 506, a second gate 507, a third gate 508, and a fourth gate 509. An end of the first gate 506 and an end of the second gate 507 intersect at a first intersection point (i.e., first node), and an end of the third gate 508 and an end of the fourth gate 509 intersect at a second intersection point (i.e., second node).

In some embodiments, the first gate 506, the second gate 507, the third gate 508 and the fourth gate 509 are all of the same size in the second direction, and the first gate 506, the second gate 507, the third gate 508, and the fourth gate 509 are all of the same size in the first direction.

It can be understood that in a case that the first gate 506, the second gate 507, the third gate 508 and the fourth gate 509 are all of the same size, it is possible to ensure that the transistor in which each gate is located have substantially the same performance as far as possible, thereby facilitating that the difference between read and write operations of each memory cell tends to be smaller.

In this case, an end of the first gate 506 away from the second gate 507 is flush along the first direction with an end of the third gate 508 away from the fourth gate 509, and an end of the second gate 507 away from the first gate 506 is flush along the first direction with an end of the fourth gate 509 away from the third gate 508.

Figure 4A:
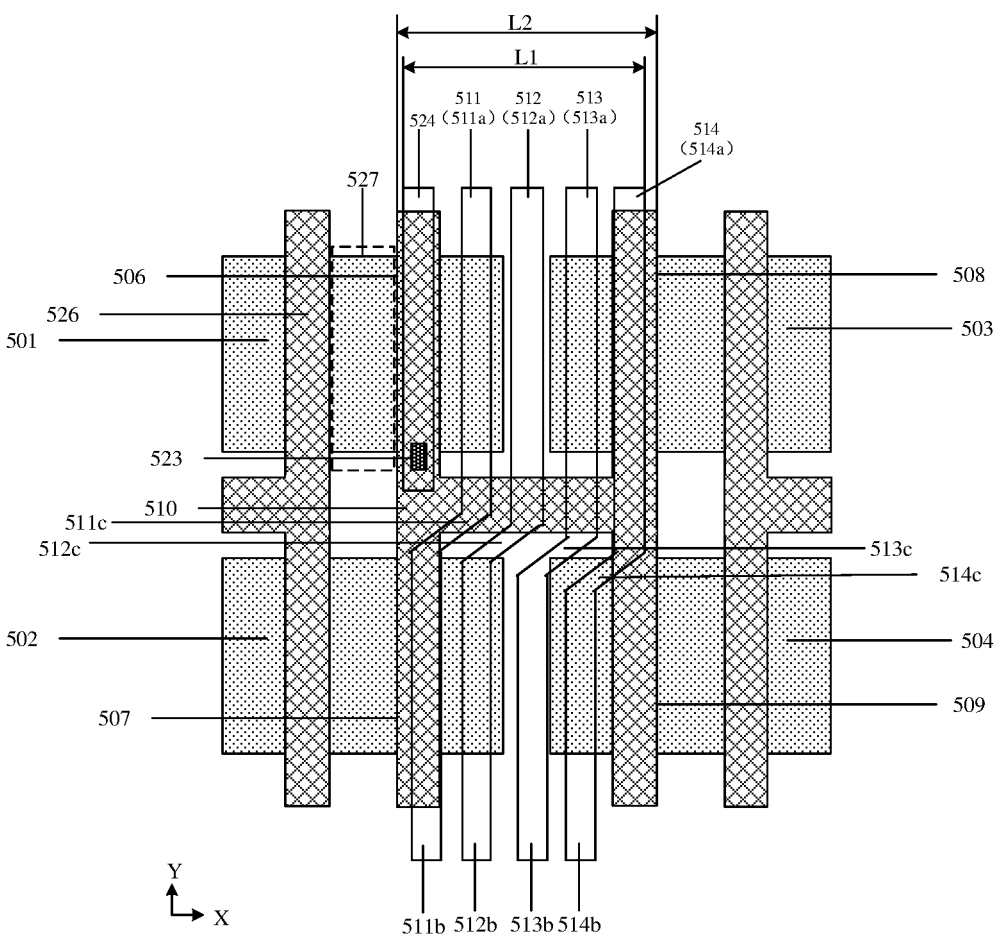
FIGS. 4A-4D are four layout diagrams of another semiconductor structure provided by embodiments of the present disclosure.

Exemplarily, with reference to FIG. 4A, the bit line select unit further includes a connection line 510 extending along the X-axis direction. Specifically, the connection line 510 is a conductive connection line. The connection line 510 electrically connects the first intersection point and the second intersection point.

In some embodiments, a size of the connection line 510 along the second direction are greater than or equal to a size of each of the first gate 506, the second gate 507, the third gate 508 and the fourth gate 509 along the first direction.

It can be understood that in a case that a line width (i.e., the size along the second direction) of the connection line 510 is the same as a line width (i.e., the size along the first direction) of each of the first gate 506, the second gate 507, the third gate 508 and the fourth gate 509, there is no hopping in the line widths between the gates and the connection line, so that the signals are transmitted smoothly, and the manufacturing process is relatively simple. In a case that the line width of the connection line 510 is greater than the line width of each of the first gate 506, the second gate 507, the third gate 508 and the fourth gate 509, a resistance of the wider connection line is lower, which can reduce resistance capacitance (RC) delays of bit line selection signals.

In some embodiments, materials of the first gate 506, the second gate 507, the third gate 508 and the fourth gate 509 and the connection line 510 include but are not limited to polysilicon (Poly).

In some embodiments, four active regions adjacent to each other in the multiple active regions include a first active region 501, a second active region 502, a third active region 503 and a fourth active region 504. The first gate 506 is located on the first active region 501, the second gate 507 is located on the second active region 502, the third gate 508 is located on the third active region 503, and the fourth gate 509 is located on the fourth active region 504.

The first node is located between the first active region 501 and the second active region 502, and the second node is located between the third active region 503 and the fourth active region 504.

The first node is located on an insulating structure between the first active region 501 and the second active region 502, and the second node is located on an insulating structure between the third active region 503 and the fourth active region 504.

The first gate 506, the second gate 507, the third gate 508, the fourth gate 509 and the connection line 510 are arranged to form a positive "H" shape, and the layout of the positive "H" has a regular shape and good symmetry. It will be appreciated that, in manufacturing, the first gate 506 spanning the first active region 501 and the second gate 507 spanning the second active region 502 are in the same straight line along the second direction and may be formed at the same time. The third gate 508 spanning the third active region 503 and the fourth gate 509 spanning the fourth active region 504 are on the same straight line along the second direction and may be formed at the same time. The connection line 510 is on a same straight line along the first direction, and the manufacture of the connection line 510 is relatively simple. Apparently, the manufacturing process corresponding to the "H"-shaped arrangement is less difficult and the procedure of the manufacturing process is relatively simple compared with the manufacturing process corresponding to the "H"-shaped arrangement with a certain inclination angle in the bit line select unit in FIG. 3A.

Further, the plan view of the semiconductor structure after optical proximity correction and etching process is shown in FIG. 4E. Although the actual shape of each gate and connection line in the bit line select unit is somewhat different from that in FIG. 4A after the OPC, compared with FIG. 3B, an orthographic projection of a connection line between the third gate 508 and the fourth gate 509 on a plane on which the third active region 503 is located does not overlap with the third active region 503, and substantially maintains the straight shape of the third gate 508. Therefore, the situation shown in FIG. 3B will not occur in FIG. 4E. The situation shown in FIG. 3B is that the orthographic projection of the first connection line 410 of the bit line select unit on the plane on which the first active region 401 is located overlaps with the first active region 401, which results in channel widening and thus affects the device performance.

Each of the multiple bit lines may include three portions, i.e., a first portion, a second portion, and a connection portion connecting the first portion and the second portion. In some embodiments, the multiple bit lines include a first bit line, a second bit line, a third bit line, and a fourth bit line arranged in sequence along a first direction. Exemplarily, with reference to FIG. 4A, the multiple bit lines include a first bit line 511, a second bit line 512, a third bit line 513 and a fourth bit line 514 arranged in sequence along the X-axis direction. The first bit line 511 includes: a first portion 511*a* and a second portion 511*b* both extending along the Y-axis direction and being misaligned in the X-axis direction, and a first connection portion 511*c* connecting the first portion 511*a* and the second portion 511*b*. The second bit line 512 includes: a first portion 512*a* and a second portion 512*b* both extending along the Y-axis direction and being misaligned in the X-axis direction, and a second connection portion 512*c* connecting the first portion 512*a* and the second portion 512*b*. The third bit line 513 includes: a first portion 513*a* and a second portion 513*b* both extending along the Y-axis direction and being misaligned in the X-axis direction, and a third connection portion 513*c* connecting the first portion 513*a* and the second portion 513*b*. The fourth bit line 514 includes: a first portion 514*a* and a second portion 514*b* both extending along the Y-axis direction and being misaligned in the X-axis direction, and a fourth connection portion 514*c* connecting the first portion 514*a* and the second portion 514*b*. It should be noted that the connection portion in each bit line may extend along the first direction or along a third direction. The third direction may be any direction that intersects both the first direction and the second direction.

In some embodiments, as shown in FIG. 4A, the first portion 511*a* of the first bit line 511 and the second portion 512*b* of the second bit line 512 are on the same straight line parallel to the second direction, and the first portion 513*a* of the third bit line 513 and the second portion 514*b* of the fourth bit line 514 are on the same straight line parallel to the second direction.

In practical application, the first portion 512*a* of the second bit line 512 and the second portion 513*b* of the third bit line 513 are also on the same straight line parallel to the second direction. An orthographic projection of one of the first portion or the second portion of each bit line on the plane on which the active regions are located falls within the respective active region. In this case, when the active regions are aligned along the first direction and the second direction, each bit line may be connected to a position which is the same as the position corresponding to a respective active region.

In other embodiments, the first portion 511*a* of the first bit line 511 and the second portion 512*b* of the second bit line 512 may not be on the same straight line parallel to the second direction, but may be slightly misaligned. The first portion 513*a* of the third bit line 513 and the second portion 514*b* of the fourth bit line 514 are also not on the same straight line parallel to the second direction, but are slightly misaligned. In this case, when the active regions are aligned along the first direction and the second direction, each bit line may be connected to a position which is slightly misaligned from the position corresponding to a respective active region.

It can be understood that since the first portion and the second portion, which serve as the main components of each bit line, are straight, there are no protruding portions and misaligned bent portions shown in FIG. 2, and the coupling effect and the noise effect between two adjacent bit lines will be greatly reduced. At the same time, when each bit line has and can only be controlled to connect the same position corresponding to the respective active region, the performance of the transistor in which each gate is located can be ensured to be basically the same as possible, thereby facilitating the difference of data read by each memory cell to tend to be smaller.

In some embodiments, the first bit line, the second bit line, the third bit line and the fourth bit line are all equally spaced from each other.

It can be understood that the distance between two adjacent bit lines is equal, which can ensure the consistency of parameters, such as parasitic capacitance, of bit lines, thereby facilitating the uniformity of read and write operations of each memory cell.

In some embodiments, a total size of orthographic projections of the first bit line, the second bit line, the third bit line and the fourth bit line on the plane on which the active regions are located along the first direction is less than a total size of orthographic projections of the first gate, the second gate, the third gate and the fourth gate on the plane on which the active regions are located along the first direction.

The total size of the orthographic projections of the first bit line, the second bit line, the third bit line and the fourth bit line on the plane on which the active regions are located along the first direction can be understood with reference to L1 in FIG. 4A, and the total size of the orthographic projections of the first gate, the second gate, the third gate and the fourth gate on the plane on which the active regions are located along the first direction can be understood with reference to L2 in FIG. 4A.

It will be understood that L1 being less than L2 ensures that an orthographic projection of a portion of each bit line corresponding to a bit line select unit that is not connected to the active region falls within an orthographic projection of a corresponding gate of the bit line select unit or within the insulating structure between adjacent active regions, so that the bit lines do not affect the connection between the LIO and a portion 527 of the active region outside each gate of the bit line select unit (e.g., the active region on a side of the first gate, the second gate, the third gate and the fourth gate away from the connection line).

In some embodiments, the bit line select unit further includes a source region and a drain region located on either side of each gate corresponding to a respective one of the four active regions adjacent to each other. The first bit line is connected to a source region or a drain region on a side of the first gate close to the connection line, the second bit line is connected to a source region or a drain region on a side of the second gate close to the connection line, the third bit line is connected to a source region or a drain region on a side of the third gate close to the connection line, and the fourth bit line is connected to a source region or a drain region on a side of the fourth gate close to the connection line.

Each bit line is respectively connected to a source region or a drain region in the active region on an inner side of a respective gate of the bit line select unit, i.e., on a side of each of the first gate, the second gate, the third gate and the fourth gate close to the connection line. In practical application, a source region or a drain region in the active region on an outer side of the respective gate of the bit line select unit (i.e., on a side of the first gate, the second gate, the third gate and the fourth gate away from the connection line) is connected to the LIO.

In some embodiments, the semiconductor structure includes multiple bit line select units, and two adjacent bit line select units along the first direction share two adjacent active regions along the second direction.

The semiconductor structure may include multiple bit line select units arranged in an array, and the gates of two adjacent bit line select units along the first direction share an active region. Exemplarily, with reference to FIG. 4A, a bit line select unit in which the fifth gate 526 is located is adjacent in the X-axis direction to a bit line select unit in which the first gate 506 is located, the two bit line select units share the first active region 501, and the transistor in which the fifth gate 526 is located and the transistor in which the first gate 506 is located share the source or drain in the active region 501 corresponding to the fifth gate 526 and the first gate 506. In such a manner, an area occupied by the transistor is effectively miniaturized and the size of the semiconductor structure is reduced.

In some embodiments, the bit line select unit further includes a conductive contact 523 located on any one of the first gate, the second gate, the third gate and the fourth gate and close to the connection line.

Figure 4B:
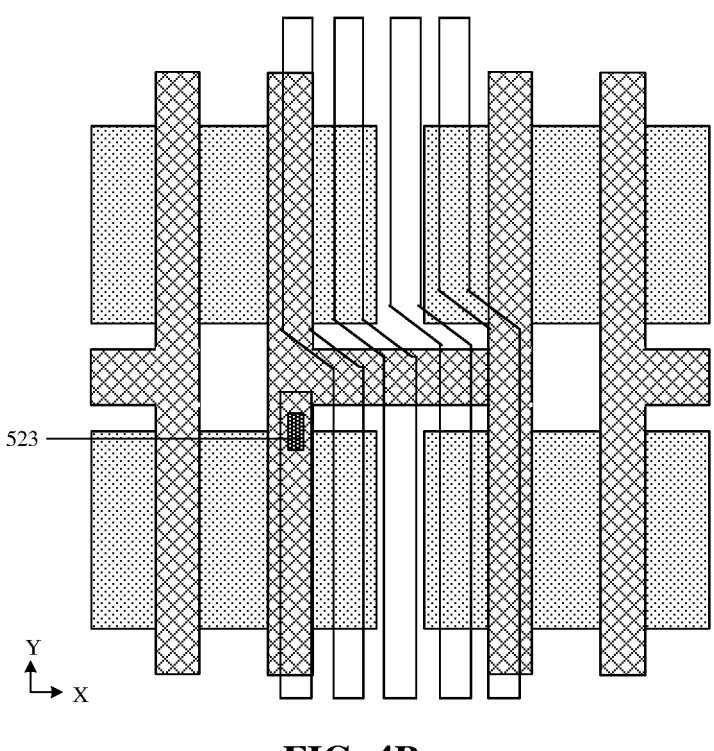
Figure 4C:
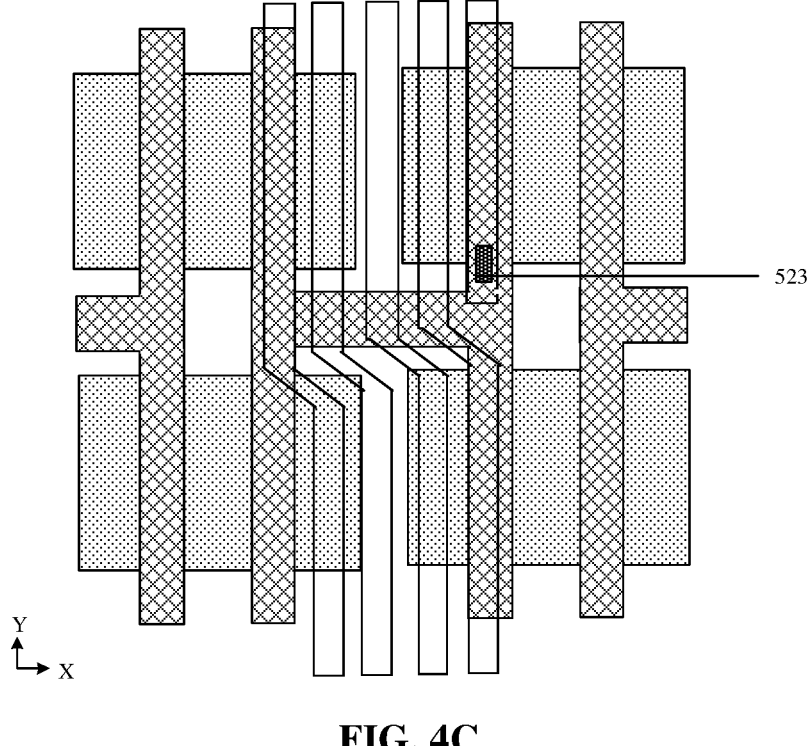
Figure 4D:
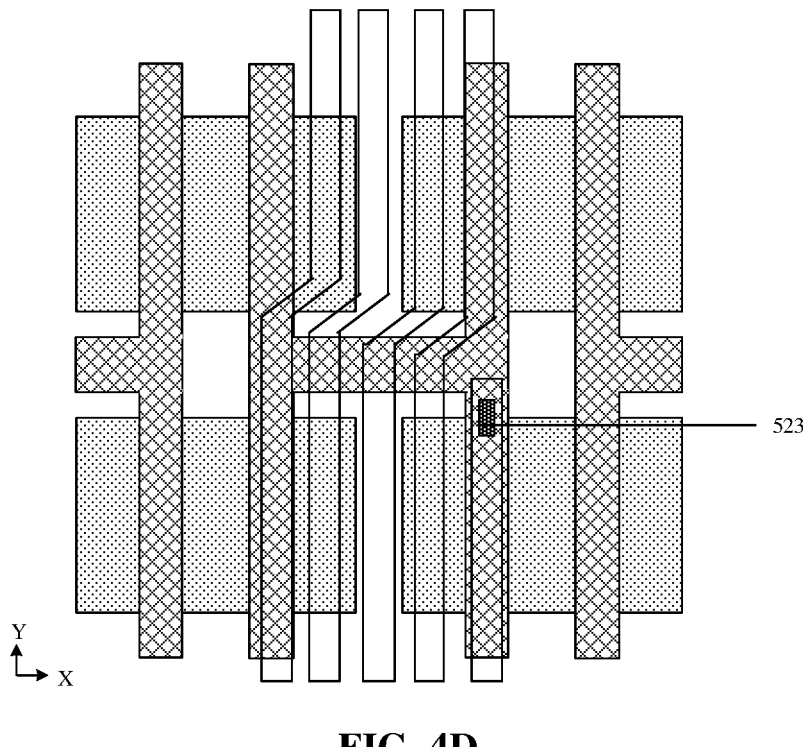
Figure 4E:
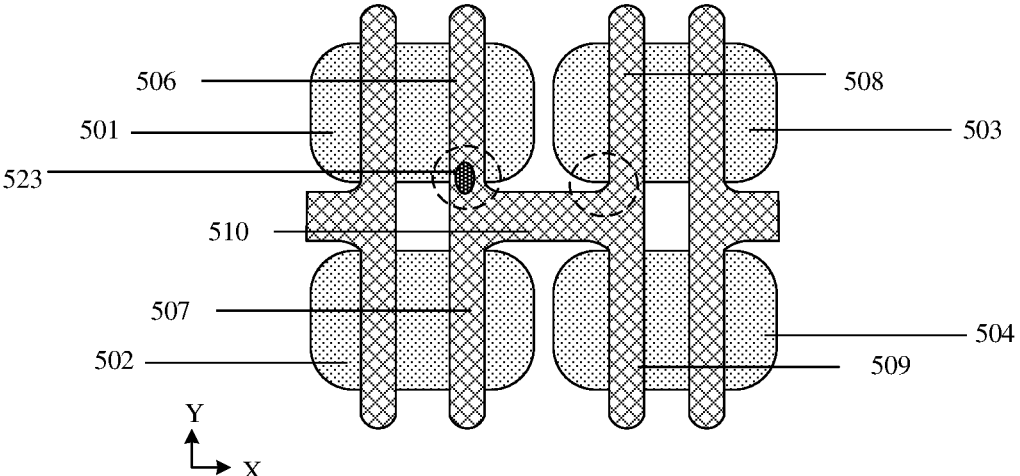
FIG. 4E is a plan view of the semiconductor structure provided in FIG. 4A after optical proximity correction and etching process.

Exemplarily, the conductive contact 523 in FIG. 4A is located on the first gate and close to the connection line. The conductive contact 523 in FIG. 4B is located on the second gate and close to the connection line. The conductive contact 523 in FIG. 4C is located on the third gate and close to the connection line. The conductive contact 523 in FIG. 4D is located on the fourth gate and close to the connection line.

As described below with reference to FIG. 4A, the conductive contact 523 is located on the first gate and close to the connection line, and a relative distance between the conductive contact 523 and each of positions of gates of the four transistors is relatively balanced, which can effectively avoid the case shown in FIG. 2 in which the conductive contact is positioned so that the conductive contact is significantly farther from gates of two transistors than from the gates of other two transistors. At the same time, the conductive contact in the present invention does not pass through the gates of other transistors when supplying power to the four transistors, which is beneficial to reduce the problem of voltage drop and delay caused by the operation of other transistors.

Theoretically, the conductive contact 523 is preferably located a little further lower than the position shown in FIG. 4A, and located in the middle of the first gate and the second gate, so that the relative distance between the conductive contact 523 and each of the positions where the gates of the four transistors are located is more balanced.

However, in the bit line of the "H" shape bit line select unit, there is a connection portion connecting the first portion and the second portion, and the bending of the connection portion is related to the position of the conductive contact 523. As shown in FIG. 4A, the conductive contact 523 is located on the first gate and close to the position of the connection line, then an orthographic projection of the first portion 511*a* of the first bit line 511 close to the conductive contact 523 on a plane on which the active regions are located is located within an active region, and an orthographic projection of the second portion 511*b* of the first bit line 511 on a plane on which the active regions are located is located within an orthographic projection of the second gate 507 on a plane on which the active regions are located. The bending of the first connection portion 511*c* connecting the first portion 511*a* and the second portion 511*b* of the bit line makes the second portion 511*b* of the first bit line 511 closer to the second gate 507. Connection portions of all the bit lines for connecting the first portion and the second portion are parallel to each other, so that each bit line is arranged in a shape similar to "Z" reversed by 90 degrees. If the conductive contact 523 is moved downward to a intermediate position between the first gate and the second gate, in a case that the position of the bit line is unchanged, the space between the conductive contact 523 and the first connection portion of the first bit line is too small, and problems such as short connection may occur.

If the conductive contact 523 is moved downward to the intermediate position between the first gate and the second gate, in order to ensure the space between the conductive contact 523 and the first connection portion 511*c* of the first bit line 511, so as to match the current process, the positions of all the bit lines will be moved downward as a whole, and orthographic projections of the third connection portion 513*c* of the third bit line 513 and the fourth connection portion 514*c* of the fourth bit line 514 on the plane on which the active regions are located will mostly fall within the fourth active region 504, which will aggravate the coupling effect and the noise effect between the bit lines, thereby reducing the performance of the semiconductor structure.

In some embodiments, the orthographic projection of the conductive contact on the plane on which the active regions are located is in a strip shape.

A size of the strip shape of the conductive contact 523 in the Y-axis direction is greater than a size of the strip shape of the conductive contact 523 in the X-axis direction, because the narrower size in the X-axis direction is advantageous to the arrangement of the conductive contact, and the orthographic projection of the conductive contact 523 on the plane on which the active regions are located can more conveniently fall within the orthographic projection of the first gate on a plane on which the active region is located, which effectively reduces the risk that the conductive contact slips out as shown in FIG. 3B, and at the same time, reduces the risk of short circuit caused by the contact between conductive contact and the active region. In some embodiments, an orthographic projection of the conductive contact on a plane on which the active regions are located is within an orthographic projection of any one of the gates on which the conductive contact is located on the plane on which the active regions are located, and is separate from orthographic projections of the multiple bit lines on the plane on which the active regions are located.

The orthographic projection of the conductive contact on the plane on which the active regions are located is located within the orthographic projection of any one of the gates on the plane on which the active regions are located, which can ensure good contact between the conductive contact and the corresponding gate and avoid the risk of short circuit and leakage.

In some embodiments, the orthographic projection of the conductive contact 523 on the plane on which the active regions are located is within the orthographic projection of any one of the gates on the plane on which the active regions are located, and the orthographic projection of the conductive contact does not coincide with the orthographic projection of any one of the active regions.

In order to realize that the orthographic projection of the conductive contact on the plane on which the active regions are located is separate from the orthographic projections of the multiple bit lines on the plane on which the active regions are located, it is necessary to consider the position of the conductive contact and the bending direction of the bit line. FIGS. 4A to 4D respectively illustrate the setting of the bending direction corresponding to each of the bit lines when different conductive contacts are arranged at different positions.

In some embodiments, the bit line select unit further includes a column select line 524 connected to the conductive contact and extending along the second direction. The orthographic projection of the column select line on the plane on which the active regions are located is separate from the orthographic projections of the multiple bit lines on the plane on which the active regions are located.

The column select line 524 is used to transmit bit line selection signals to each gate in the bit line select unit.

It can be understood that the orthographic projection of the column select line 524 on the plane on which the active regions are located and the orthographic projections of the multiple bit lines on the plane on which the active regions are located are separated from each other, to avoid a short circuit caused by the intersection of the column select line 524 and the bit line. At the same time, the extension of the conductive contact lead along the second direction indicates that the conductive contact lead is parallel to the first portion of the bit line, and the conductive contact lead is in a straight line, which reduces the coupling effect and the noise effect between the conductive contact lead and the bit line.

According to another aspect of the present disclosure, an embodiment of the present disclosure further provides a memory including any one of the semiconductor structures in the aforementioned embodiments. Features disclosed in several method or device embodiments provided in the present disclosure can be arbitrarily combined, without conflict, to obtain new method or device embodiments.

Although the above specific embodiments are described, the scope of protection of the present disclosure is not limited thereto. Any person skilled in the art can readily conceive of modifications or substitutions within the technical scope of the present disclosure that should be covered by the scope of protection of the present disclosure. Therefore, the scope of protection of the present disclosure shall be subject to the scope of protection of the claims.

INDUSTRIAL APPLICABILITY

The gates and the connection line included in the bit line select unit in the embodiments of the present disclosure form an "H" shape, and the bit line select unit of the "H" shape can effectively reduce the difficulty of process manufacturing, in particular, help Optical Proximity Correction (OPC) to improve the actual shape of the bit line select unit, and effectively improve the product output and yield. At the same time, multiple bit lines are arranged along a first direction. Each of the multiple bit lines includes a first portion and a second portion both extending along a second direction and misaligned along the first direction, and a connection portion connecting the first portion and the second portion. Each bit line is connected to a respective one of the multiple the active regions, different active regions are connected to different bit lines. It can be understood that the bit line in various embodiments of the present disclosure form a "Z" shape reversed by 90 degrees, and the body of the bit line in each active region is in a straight line, and the straight body of the bit line can effectively reduce the coupling effect and the noise between adjacent bit lines, which improves the performance of semiconductor structure.

The invention claimed is:
1. A semiconductor structure, comprising:
a plurality of active regions that are arranged in an array along a first direction and a second direction that are orthogonal, the first direction being parallel to a direction in which the plurality of active regions extend;
a column selector, comprising:
a first gate, a second gate, a third gate and a fourth gate, each of which is located on a respective one of four active regions adjacent to each other among the plurality of active regions, the first gate and the second gate extending along the second direction and intersecting at a first node, and the third gate and the fourth gate extending along the second direction and intersecting at a second node; and
a connection line connecting the first node and the second node and extending along the first direction; and
a plurality of bit lines that are arranged along the first direction, each of the plurality of bit lines comprising:
a first portion and a second portion both extending along the second direction and being misaligned in the first direction, and
a connection portion connecting the first portion and the second portion, wherein
each of the plurality of bit lines is connected to a respective one of the plurality of the active regions, the active regions connected to different bit lines among the plurality of bit lines are different, and for each bit line, the first portion of the bit line and a second portion of an adjacent bit line are on a same straight line parallel to the second direction.
2. The semiconductor structure of claim 1, wherein the column selector further comprises a conductive contact that is located on one of the first gate, the second gate, the third gate and the fourth gate and close to the connection line.
3. The semiconductor structure of claim 2, wherein the conductive contact has a strip-shaped orthographic projection on a plane on which the plurality of active regions are located.

4. The semiconductor structure of claim 2, wherein the conductive contact has an orthographic projection on a plane on which the plurality of active regions are located, wherein the orthographic projection of the conductive contact is within an orthographic projection of the one of the first gate, the second gate, the third gate and the fourth gate on the plane on which the plurality of active regions are located, and is separate from orthographic projections of the plurality of bit lines on the plane on which the plurality of active regions are located.

5. The semiconductor structure of claim 2, wherein the column selector further comprises a column select line that is connected to the conductive contact and extends along the second direction, wherein the column select line has an orthographic projection on a plane on which the plurality of active regions are located, and the orthographic projection of the column select line is separate from orthographic projections of the plurality of bit lines on the plane on which the plurality of active regions are located.

6. The semiconductor structure of claim 1, wherein the four active regions adjacent to each other among the plurality of active regions comprise a first active region, a second active region, a third active region and a fourth active region, wherein the first gate is located on the first active region, the second gate is located on the second active region, the third gate is located on the third active region, and the fourth gate is located on the fourth active region; and
    wherein the first node is located between the first active region and the second active region, and the second node is located between the third active region and the fourth active region.

7. The semiconductor structure of claim 6, wherein the plurality of bit lines comprise a first bit line, a second bit line, a third bit line and a fourth bit line that are arranged in sequence along the first direction, wherein a first portion of the first bit line and a second portion of the second bit line are on a same straight line parallel to the second direction, and a first portion of the third bit line and a second portion of the fourth bit line are on a same straight line parallel to the second direction.

8. The semiconductor structure of claim 7, wherein the first bit line, the second bit line, the third bit line and the fourth bit line are all equally spaced from each other.

9. The semiconductor structure of claim 7, wherein the column selector further comprises a source region and a drain region that are located on either side of each of the first, second, third and fourth gates corresponding to a respective one of the four active regions adjacent to each other, wherein the first bit line is connected to a source region or a drain region on a side of the first gate close to the connection line, the second bit line is connected to a source region or a drain region on a side of the second gate close to the connection line, the third bit line is connected to a source region or a drain region on a side of the third gate close to the connection line, and the fourth bit line is connected to a source region or a drain region on a side of the fourth gate close to the connection line.

10. The semiconductor structure of claim 7, wherein a total size of orthographic projections of the first bit line, the second bit line, the third bit line and the fourth bit lines on a plane on which the plurality of active regions are located along the first direction is less than a total size of orthographic projections of the first gate, the second gate, the third gate and the fourth gate on the plane on which the plurality of active regions are located along the first direction.

11. The semiconductor structure of claim 1, wherein the first gate, the second gate, the third gate and the fourth gate are all of a same size along the second direction, and the first gate, the second gate, the third gate and the fourth gate are all of a same size along the first direction.

12. The semiconductor structure of claim 9, wherein a size of the connection line along the second direction is greater than or equal to a size of each of the first gate, the second gate, the third gate and the fourth gate along the first direction.

13. The semiconductor structure of claim 1, wherein the semiconductor structure comprises a plurality of column selectors, wherein two column selectors that are adjacent along the first direction among the plurality of column selectors share two active regions that are adjacent along the second direction among the plurality of active regions.

14. A memory, comprising a semiconductor structure, wherein the semiconductor structure includes:
    a plurality of active regions that are arranged in an array along a first direction and a second direction that are orthogonal, the first direction being parallel to a direction in which the plurality of active regions extend;
    a column selector, comprising:
      a first gate, a second gate, a third gate and a fourth gate, each of which is located on a respective one of four active regions adjacent to each other among the plurality of active regions, the first gate and the second gate extending along the second direction and intersecting at a first node, and the third gate and the fourth gate extending along the second direction and intersecting at a second node; and
      a connection line connecting the first node and the second node and extending along the first direction; and
    a plurality of bit lines that are arranged along the first direction, each of the plurality of bit lines comprising:
      a first portion and a second portion both extending along the second direction and being misaligned in the first direction, and
      a connection portion connecting the first portion and the second portion, wherein
      each of the plurality of bit lines is connected to a respective one of the plurality of the active regions, the active regions connected to different bit lines among the plurality of bit lines are different, and for each bit line, the first portion of the bit line and a second portion of an adjacent bit line are on a same straight line parallel to the second direction.

\* \* \* \* \*